United States Patent [19]

Sato et al.

[11] 4,211,973

[45] Jul. 8, 1980

[54] APPARATUS FOR DETECTING FAULTS TO BE OCCURRED OR INITIALLY EXISTING IN A RUNNING ELECTRIC ROTARY MACHINE

[75] Inventors: Tetsuya Sato; Osamu Kato; Hisashi Saito, all of Hyogo, Japan

[73] Assignee: Kabushiki Kaisha Teikoku Denki Seisakusho, Osaka, Japan

[21] Appl. No.: 870,361

[22] Filed: Jan. 18, 1978

Related U.S. Application Data

[63] Continuation of Ser. No. 687,050, May 17, 1976, abandoned, which is a continuation of Ser. No. 404,615, Oct. 9, 1973, abandoned.

[30] Foreign Application Priority Data

Oct. 11, 1972 [JP] Japan .............................. 47-101731
Feb. 9, 1973 [JP] Japan .............................. 48-17882

[51] Int. Cl.² ........................................... G01R 31/02
[52] U.S. Cl. .............................. 324/158 MG; 324/51
[58] Field of Search ................. 324/158 MG, 127, 51

[56] References Cited

U.S. PATENT DOCUMENTS

| | | | |
|---|---|---|---|
| 2,640,100 | 5/1953 | Packer et al. | 324/158 MG |
| 2,939,074 | 5/1960 | Perrett | 324/158 MG |

*Primary Examiner*—Rudolph V. Rolinec
*Assistant Examiner*—Ernest F. Karlsen
*Attorney, Agent, or Firm*—Stevens, Davis, Miller & Mosher

[57] ABSTRACT

Apparatus for detecting possible changes or variations in the dimension of an air gap of a running electric rotary machine during operation thereof. Detector coils are each accommodated within respective slots formed in the stator core of the machine, the coils being geometrically separated from one another at an angular distance corresponding to the distance between poles or its integral multiple. The detector coils are electrically connected in series with each other to produce a voltage for detection. The detector coils are so connected that the fundamental waves of the voltages induced in two detector coils will cancel each other and a synthesized value of higher harmonics induced in both detector coils is picked up as the detection voltage signal. The number of slots of the rotor of the electric rotary machine is predetermined to a limited number in order to get a detection signal of higher quality.

1 Claim, 19 Drawing Figures

APPARATUS FOR DETECTING FAULTS TO BE OCCURRED OR INITIALLY EXISTING IN A RUNNING ELECTRIC ROTARY MACHINE

This is a continuation of application Ser. No. 687,050 filed May 17, 1976, which in turn is a continuation of application Ser. No. 404,615 filed Oct. 9, 1973, both now abandoned.

BACKGROUND OF THE INVENTION

The present invention relates to an apparatus for detecting faults to which may occur or initially exist in a running electric rotary machine to thereby determine if the machine is operating in a normal state mechanically as well as electrically.

Detector apparatus utilizing a vibration measuring instrument or a thermometer has hitherto been used for the detection of the eccentric revolution or vibration of the rotor shaft and wear of bearings. A detector comprising an annular electrode disposed adjacent to the rotating shaft is also known from Japanese Utility Model Application Publication No. 19,281/67. Another known type of detector is composed of a proximity switch provided near the rotating shaft of the electric rotary machine as taught in Japanese Utility Model Application Publication No. 15,880/68. Furthermore, Japanese Utility Model Application Publication No. 1,864/69 discloses a detector apparatus comprising a ring disposed in the vicinity of the rotating shaft of the rotary machine, whereby the degree or amount of the abrasion of the bearings is determined on the basic of the rotational movement of said ring.

The difficulties or disadvantages common to all the hitherto known detector apparatus of the above mentioned types reside in the fact that the accuracy of detection is directly influenced by inevitable tolerance or error in machining as well as the mounting position of the detecting member to be installed since these detector components consist of mechanical elements. Another drawback is that a spatial restriction is imposed because extra space is required for the installation of the detector elements.

An object of the present invention is to provide an improved apparatus for detecting the wear or abrasion of the bearing or bearings in an electric rotary machine, in which the disadvantages of the prior detectors are at least substantially eliminated.

Another object of the present invention is to provide an improved detector for sensing an eccentric revolutional operating state of an electric rotary machine.

Still another object of the present invention is to provide a detector for detecting unbalanced current in the main windings of an electric rotary machine.

SUMMARY OF THE INVENTION

In the present invention, possible changes or variations in the dimension of air gap between the stator and the rotor of electric rotary machines are detected as a measure of the abrasion of the bearing or bearings and eccentric rotation of the shaft by detector coils each being accommodated within respective stator slots and angularly displaced from one another by a distance corresponding to the one between the poles or an integral multiple thereof. The detector coils are connected in series with each other, whereby the fundamental wave components of the voltages induced in the detector coils cancel each other and only the higher harmonics are synthesized into a usable detection signal.

Other objects, advantages and features of the present invention will be made apparent from the following detalied description of preferred embodiments of the invention and the claims. The description makes reference to the accompanying drawings.

DETAILED DESCRIPTION OF THE INVENTION

Figure 1:
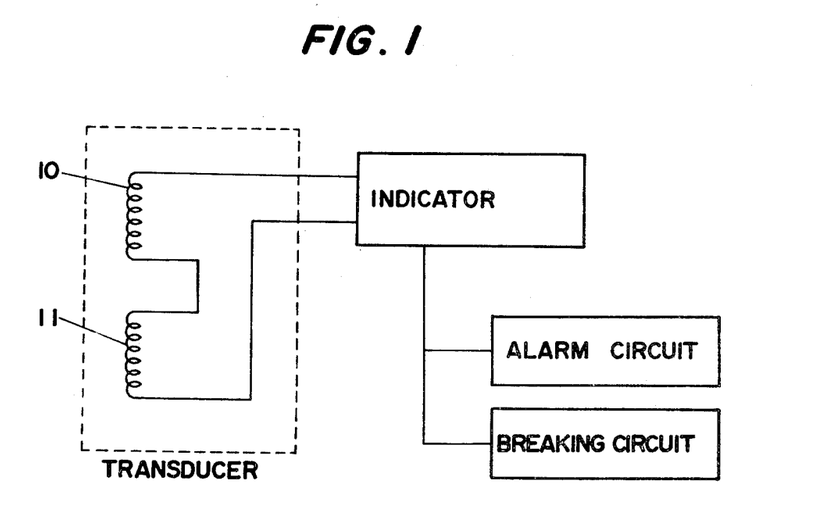
FIG. 1 is a block diagram of a detector apparatus to illustrate the principle of the present invention.

Referring to FIG. 1 which schematically shows in a block diagram a principal arrangement of an apparatus according to the present invention, the apparatus comprises a detector, an indicator, an alarm circuit and a protection circuit or circuit breaker as the fundamental components. At this point, it should be noted that the novel and inventive feature of the present invention resides in the arrangement of the detector unit. The other elements such as the indicator, alarm circuit and circuit breaker for protection may be of any conventional type. Accordingly, the description in the following will be restricted to the construction and the operation of the detector.

Figure 2:
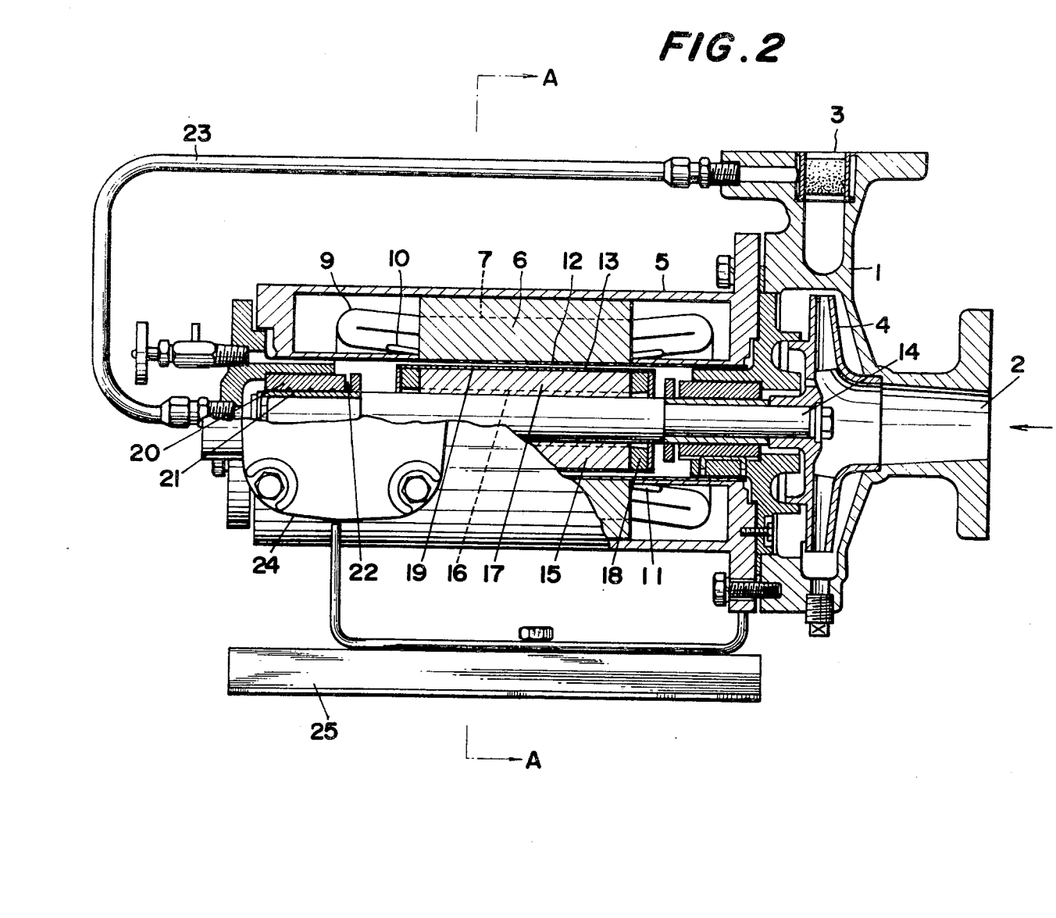
FIG. 2 is a longitudinal sectional view of a canned motor pump with a radial magnetic air gap type of motor to which the invention is applied.
Figure 3:
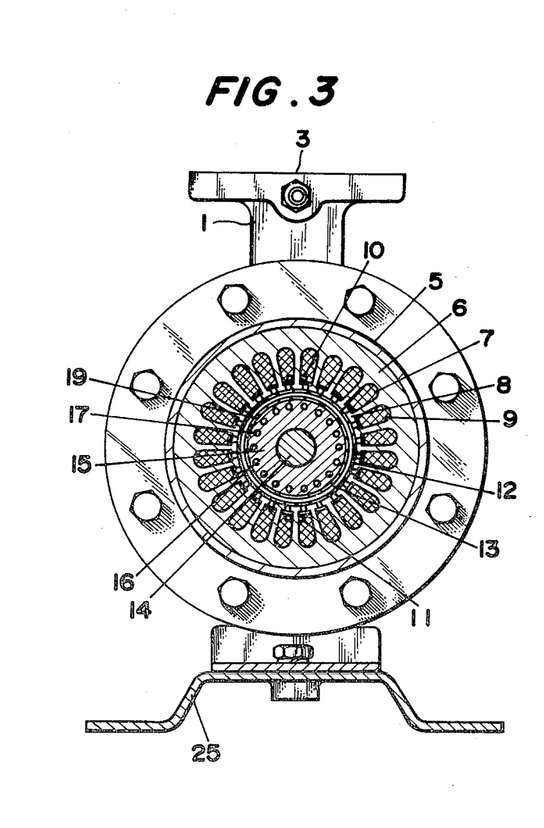
FIG. 3 shows a section of FIG. 2 taken along the line A—A.
Figure 4:
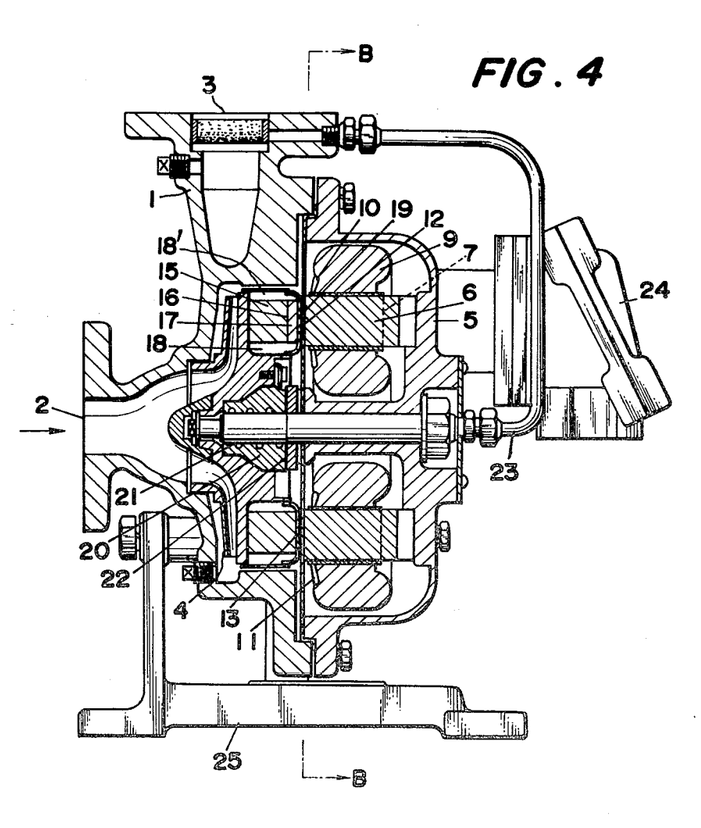
FIG. 4 is a vertical sectional view of a canned motor pump having an axial magnetic air gap type of motor to which the present invention is applied.
Figure 5:
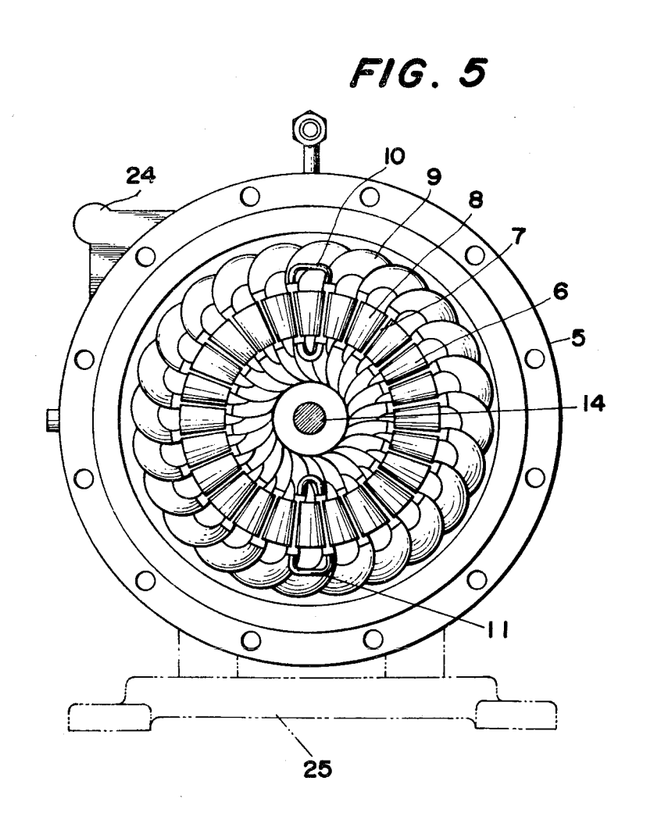
FIG. 5 shows a section of FIG. 4 taken along the line B—B.

FIGS. 2 and 3 show a structure of a canned motor pump assembly having an induction motor of a radial air gap type in which the detector according to the present invention is built. This type of induction motor will hereinafter be called an R-type motor. FIGS. 4 and 5 show a construction of another canned motor pump unit employing an induction motor of an axial air gap type (hereinafter called an A-type motor) which is provided with a detector apparatus of this invention. It is to be noted that the bipolar induction motors are used in both of the illustrated canned motor pump assemblies.

Now referring to FIGS. 2 to 5, reference numeral 1 indicates a pump casing having a liquid suction port 2 and a discharge port 3, an impeller 4 being provided between the ports 2 and 3. Numeral 5 indicates an outer frame for mounting thereon a stator 6 having a plurality of stator slots 7 which are separated from one another by stator teeth 8. Stator windings 9 are disposed within the slots 7. Detector coils of the detector apparatus according to the present invention are indicated by reference numerals 10 and 11. In order to prevent the liquid pumped from flowing into the stator assembly, a stator can 12 is provided. Reference numeral 13 indicates the magnetic air gap of the motor which is filled with the flowing liquid during operation of the pump. Reference numeral 14 indicates a shaft. In case of the R-type motor shown in FIGS. 2 and 3, this shaft 14 is adapted to be rotated, while the shaft 14 of the A-type motor shown in FIGS. 4 and 5 is fixed. Furthermore, reference numeral 15 indicates a rotor formed with a plurality of slots 16 within which cage rotor bars 17 are embedded. The rotor 15 is provided with end rings 18 and enclosed by a rotor can 19 which serves to prevent the liquid from flowing into the rotor assembly. In case of the R-type motor shown in FIGS. 2 and 3, the rotor 15 is rotatably supported by means of a pair of fixed bearings. On the other hand, in case of the A-type motor shown in FIGS. 4 and 5, a single bearing 20 is rotatably supported on the fixed shaft 14.

Reference numerals 21 and 22 indicate a radial sliding surface or radial slide member and an axial sliding surface or thrust slide member for the bearings 20 of the R- and A-type motors, respectively. A circulation tube 23 is provided to allow the liquid to flow therethrough for effecting lubrication of the bearings 20 as well as cooling of the motor. The motor pump assembly has a terminal box 24 and is fixedly mounted on a base 25.

Figure 6:
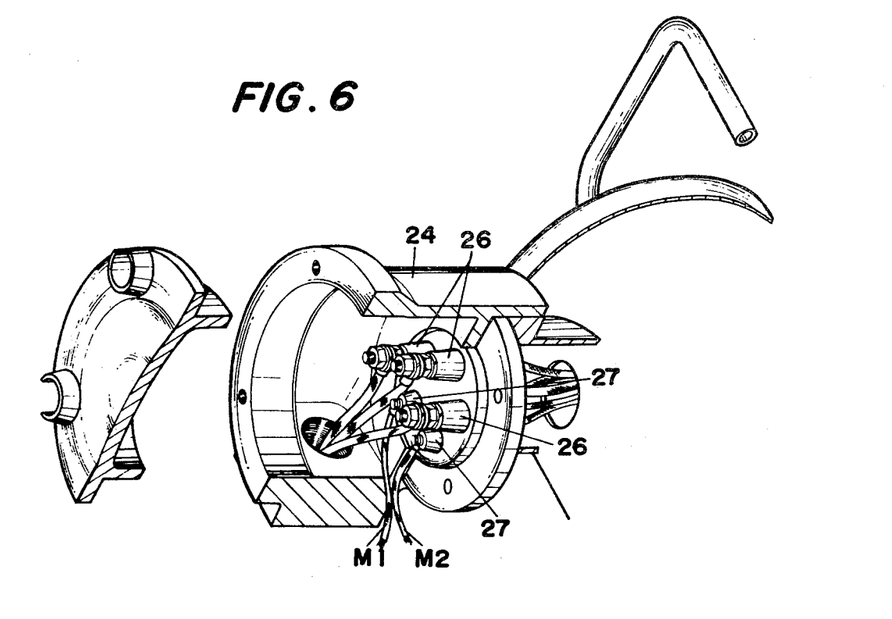
FIG. 6 is a perspective view of a terminal box showing an arrangement of terminals.

FIG. 6 shows an arrangement of terminals in the terminal box 24. Three main terminals 26 are provided each for the phases U, V and W, respectively. Electric driving power or energy is supplied to these terminals from a source network not shown. Reference numeral 27 indicates terminals for the detector according to the present invention, to which terminals of the detector coils 10 and 11 are connected by way of lead wires $M_1$ and $M_2$. Both of the detector coils 10 and 11 are of the identical configuration and have the same number of windings. In the embodiments illustrated in the drawing, the coils 10 and 11 are wound arround respective stator teeth 8 which are positioned diametrically opposite to each othe and symmetrically relative to the center of the shaft 14 or the rotational axis of the rotor 15.

The detector coils 10 and 11 are connected in series with each other between the terminals $M_1$ and $M_2$ as schematically shown in FIG. 1.

Since the general constructions of these motor pump assemblies themselves are conventional ones, further description thereof will be unnecessary.

Figure 7:
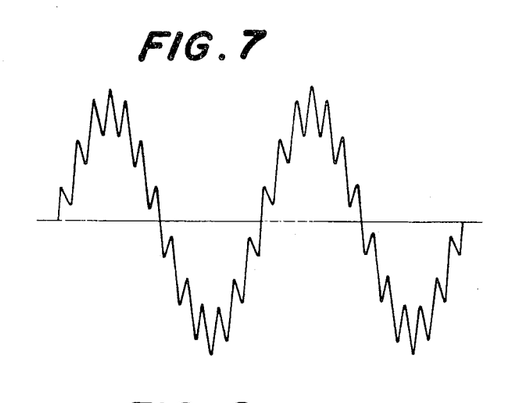
FIG. 7 shows graphically a voltage wave induced in a detector coil provided according to the invention.
Figure 8:
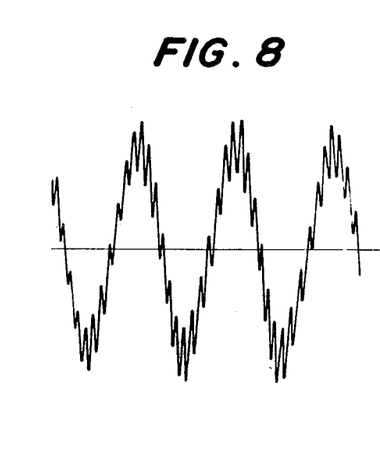
FIG. 8 is a graph of a voltage measured by oscilloscope and actually induced in the detector coil.

In operation, when electric current is supplied to the canned motor pump shown in FIGS. 2 and 3 to excite the stator winding 9, a rotating magnetic field is produced in the stator portion, whereby the rotor 15 and hence the impeller 4 integrally connected to the rotor are rotated within the casing 1, as a result of which liquid is pumped to the discharge port 3 from the suction port 2 under the action of the impeller 4. When the main winding 9 is in the excited state, a voltage of the wave form shown in FIG. 7 is induced in the detector windings or coils 10 and 11. FIG. 8 shows the corresponding wave form of the voltage induced in the coils 10 and 11 during an oscilloscopic graph taken in the actual operation of the motor. From the analysis of this voltage wave form, it has been found that the fundamental wave component has the same frequency as the supplied current, while the frequency of higher harmonic is determined by the number of rotor slots 16, the slip of the rotor 15 and the number of poles and can mathematically be expressed as follows:

$$f_H = \frac{2f_s(1-s)N_R}{P} \quad (1)$$

wherein $f_H$: frequency of higher harmonic,
$f_s$: frequency of supply source,
$N_R$: number of rotor slots,
s: slip of rotor, and
p: number of poles of the main winding.

Since a pair of the detector coils 10 and 11 are positioned symmetrically relative to the rotational axis of the rotor or, in other words, because these detector coils are angularly displaced from each other for a distance corresponding to the one between the poles of the bipolar motor, the fundamental wave components of voltages induced in these coils 10 and 11 are in phase and have the identical form. Although the harmonics produced by the frequency determined by the formula (1) are of the identical wave form, the phaserelation between them can be classified into the in-phase relation and the inversed-phase relation. When represented by mathematical expressions, $$V_1 = V_s \sin \omega_s t + V_H \sin(\omega_H t + \alpha) \quad (2)$$

$$V_2 = V_s \sin \omega_s t + V_H \sin(\omega_H t + \alpha) \quad (3)$$

$$V_2' = V_s \sin \omega_s t + V_H \sin(\omega_H t + \alpha - \pi) \quad (4)$$

wherein $V_1$: voltage produced by the detector coil 10,
$V_s$: maximum value of the fundamental wave component of $V_1$;
$\omega_s$: $\omega_s = 2\pi f_s$, angular velocity,
$\omega_H$: $\omega_H = 2\pi f_H$, angular velocity,
t: time,
$\alpha$: phase angle,
$V_2$: voltage produced by the detector coil 11 with harmonic wave being in phase with that of $V_1$, and
$V_2'$: voltage produced by the coil 11 and containing harmonic wave component of the inversed phase (out-of-phase for $\pi$) relative to that of $V_1$.

From the above equations, either the combination of (2) and (3) or (2) and (4) can be selected for deriving out the detection signal. In the first place, assuming that the fundamental waves and the harmonics induced in the coils 10 and 11 are both in phase, the case where the combination of the equations (2) and (3) can be applied will be considered.

For the availableness of this combination, it is required that the slots of the rotor have to be of an even number. If the detector coils 10 and 11 are so connected that the fundamental wave voltages $V_s \sin \omega_s t$ may cancel each other, the synthesized voltage thereof will be zero. Namely, $$V_1 - V_2 = 0 \quad (5)$$

For the R-type motor, this connection is mainly employed. When the eccentric revolution or rotational vibration of the rotating shaft occurs due to the abrasion or wear of the bearing 20 or the like during operation of the R-type motor, the formula (2) must be rewritten as follows:

$$V_1 = V_s \sin \omega_s t + \{V_H + v \sin (\omega t + \beta)\} \sin (\omega_H t + \alpha) \quad (6)$$

$v$: maximum value of voltage produced by the eccentric revolution,
$\omega$: angular velocity of the eccentric revolution, and
$\beta$: phase angle.

Additionally, the mathematical expression (3) may be replaced by the following:

$$V_2 = V_s \sin \omega_s t + \{V_H - v \sin (\omega t + \beta)\} \sin (\omega_H t + \alpha) \quad (7)$$

In the expressions (6) and (7), the sing (+, −) before the term $v \sin (\omega t + \beta)$ are inversed for the reason that, because the windings 10 and 11 are positioned diametrically opposite to each other, increment $\delta$ in the dimension of the air gap in front of the one detector coil (10 or 11) due to the eccentric revolution of the rotor will result in the corresponding decrease of $\delta$ in the air gap in front of the other detector coil (11 or 10), whereby the phase difference between the voltage $v$ will become equal to $\pi$ radians.

If $V_1$ and $V_2$ are replaced by the equations (6) and (7), the equation (5) is rewritten as follows:

$$V_1 - V_2 = 2v \sin (\omega t + \beta) \sin (\omega_H t + \alpha) \quad (8)$$

The value of $v$ is a function of the variation in the dimension of the air gap brought about by the eccentric revolution of the rotor etc. Assuming that the bearing of the motor has undergone the abrasion of an amount $\delta$, $$v = f(\delta) \quad (9)$$

From the equations (8) and (9), $$V_1 - V_2 = 2f(\delta) \sin (\omega t + \beta) \sin (\omega_H t + \alpha) \quad (10)$$

This equation (10) indicates that the voltage induced in the detector coils is a function of $\delta$. The principle of the detector according to the present invention is based on this knowledge.

The equation (8) represents a modulated harmonic having a maximum amplitude of $2v$ and a minimum value of zero. It will be thus understood that the value of $(V_1 - V_2)$ is increased in proportion to the change of $v$.

Figures 9, 10:
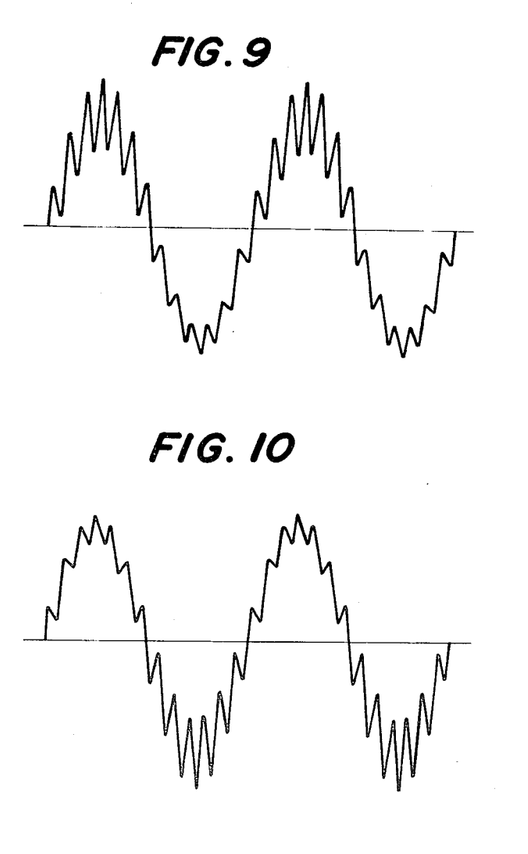
FIGS. 9 and 10 show wave forms of voltages induced, respectively, in the individual detector coil.
Figure 11:
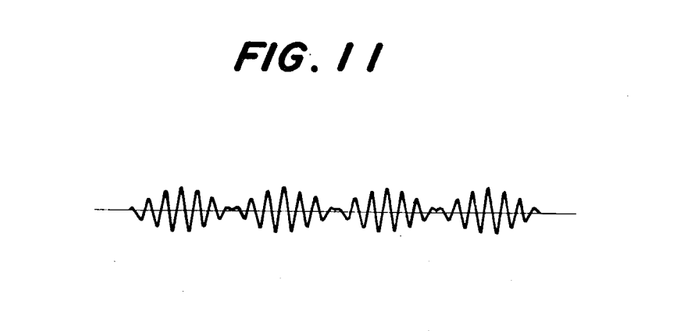
FIG. 11 shows a wave form of a difference voltage between those shown in FIGS. 9 and 10.
Figure 12:
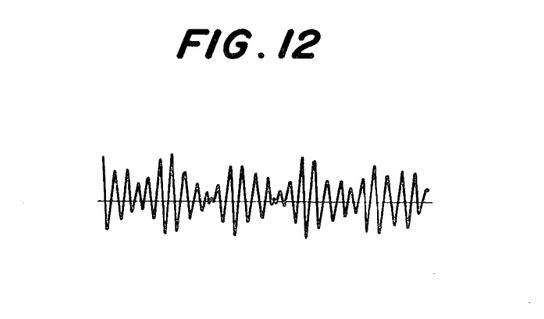
FIG. 12 is a graph of the actually measured difference voltage corresponding to the one shown in FIG. 11.

FIG. 9 shows the wave form of a voltage produced by the detector coil 10 built in a motor having a rotor formed with 14 slots, the eccentricity of which motor amounts to $\delta$. FIG. 10 shows the voltage wave form produced by the detector coil 11 of the same motor. FIG. 11 is a graphical representation of the equation (8) and FIG. 12 is an oscilloscopic graph of the voltage corresponding to the one shown in FIG. 11 as measured during the actual operation of the motor. The similarity between the curve in FIG. 11 and that of the graph in FIG. 12 supports the validity of the mathematical analysis about the principle of this invention as above mentioned.

Figure 13:
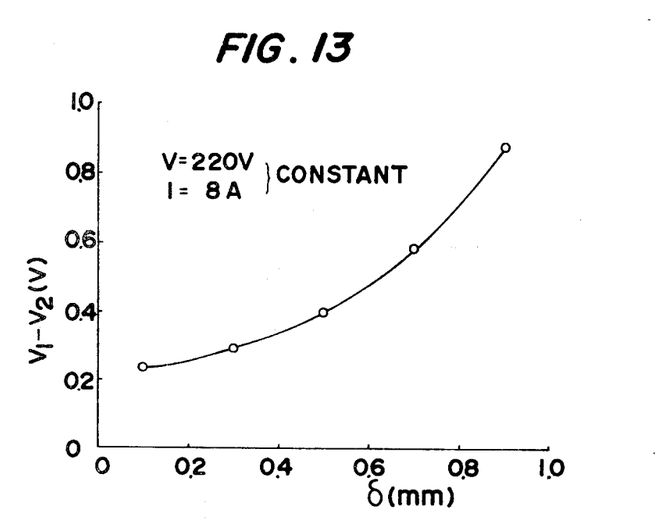
FIGS. 13 and 14 graphically show characteristics of the detector apparatus according to the invention.
Figure 14:
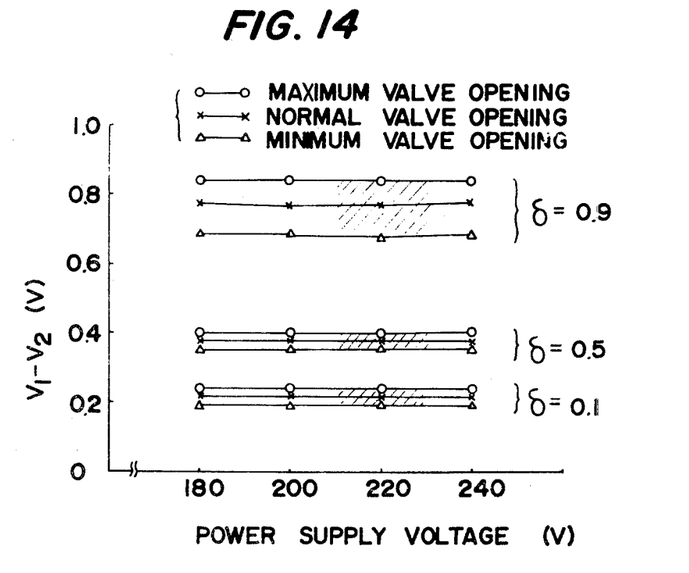

FIG. 13 shows graphically the relation between the change of $\delta$ and $(V_1 - V_2)$ which are actually measured with the sourve voltage and the load current being maintained constant. FIG. 14 shows the values of $(V_1 - V_2)$ corresponding to the variations of eccentricity $\delta$ with the variation in the source voltage also being taken into consideration, wherein the valve opening apertures are used as parameters. As will be appreciated from the graphical illustration of FIG. 14 and particularly from the hatched regions, the detector according to the present invention is capable of detecting the variation in the eccentricity $\delta$ with a high precision in all the conceivable operating states of the pump motor even if the source voltage as well as load current of the motor are subjected to considerable variations.

Next, the case in which the fundamental waves are in phase, while the harmonics are in the reverse phase (out-of-phase by $\pi$ radians), namely the case where the combination of the equations (2) and (4) can be applied will be discussed. It is assumed that the rotor slots must be of an odd number. By connecting the detector coils 10 and 11 in series so that the fundamental wave components may be cancel each other, the synthesized voltage can be expressed as follows:

$$V_1 - V_2' = V_H\{\sin (\omega_H t + \alpha) - \sin (\omega_H t + \alpha - \pi)\} = 2V_H \sin (\omega_H t + \alpha) \quad (11)$$

This combination is selected mainly for the A-type motor. The motor of this type is different from the R-type motor in the respect that the air gap is decreased as a whole or uniformly due to the abrasion of the thrust slide member 22. It is therefore important to detect the abrasion of the thrust slide member 22.

Assuming that the bearing has been worn by $\gamma$ in the thrust sliding surface the equation (2) is rewritten as follows:

$$V_1 = V_s \sin \omega_s t + (V_H + v_H) \sin (\omega_H t + \alpha) \quad (12)$$

wherein
$v_H$: maximum value of increment of harmonic voltage caused by the uniform decrement $\gamma$ of axial air gap.

Furthermore, the equation (4) can be transformed into the following form:

$$V_2' = V_s \sin \omega_s t + (V_H + v_H) \sin (\omega_H t + \alpha - \pi) \quad (13)$$

therefore, $$V_1 - V_2' = 2(V_H + v_H) \sin (\omega_H t + \alpha) \quad (14)$$

From this expression (14), it will be understood that $(V_1 - V_2')$ is equal to $\sqrt{2} V_H$ at the abrasion of zero and is increased to $\sqrt{2} (V_H + v)$ when the abrasion amounts to $\gamma$. In this manner, the variation of $\gamma$ can be detected.

Figure 15:
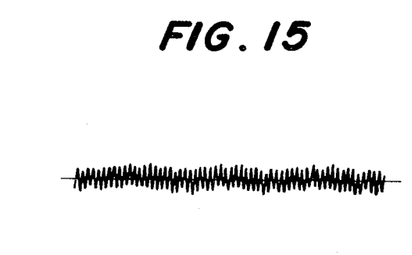
FIGS. 15 and 16 are oscilloscopic graphs showing output signals of the inventive detector apparatus.

FIG. 15 shows the wave form of voltage $(V_1 - V_2')$ expressed by the equation (11) which was measured when the A-type motor is in the normal operation with the air gap of 1.2 mm and the thrust slide memeber 22 has not yet been subjected to the abrasion or $\gamma = 0$.

Figure 16:
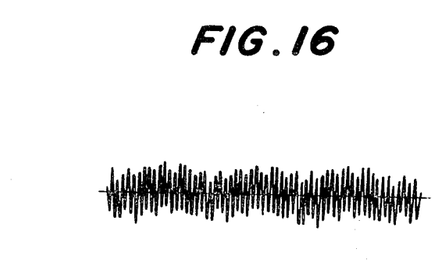

FIG. 16 shows the actually measured wave form of the voltage $(V_1 - V_2')$ expressed by the equation (14), which includes $v_H$, when the abrasion $\gamma$ of the thrust slide member 21 amounted to 0.8 mm and the air gap was decreased to 0.4 mm.

Figure 17:
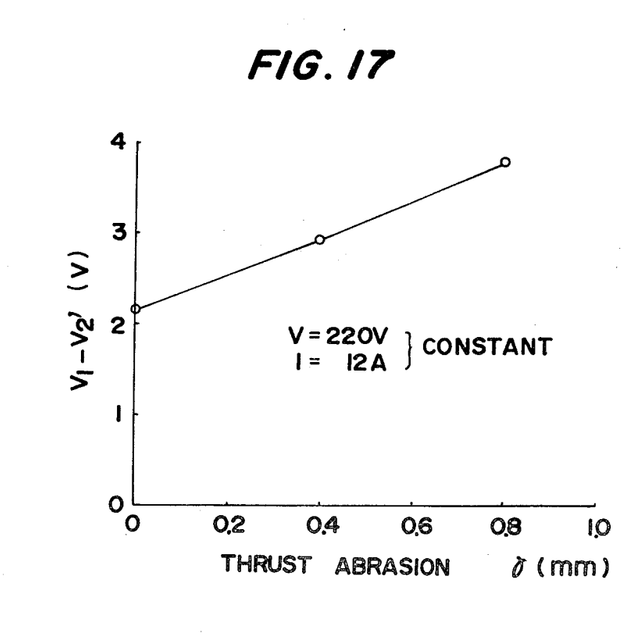
FIGS. 17, 18 and 19 show characteristic curves of the detector apparatus according to the present invention.
Figure 18:
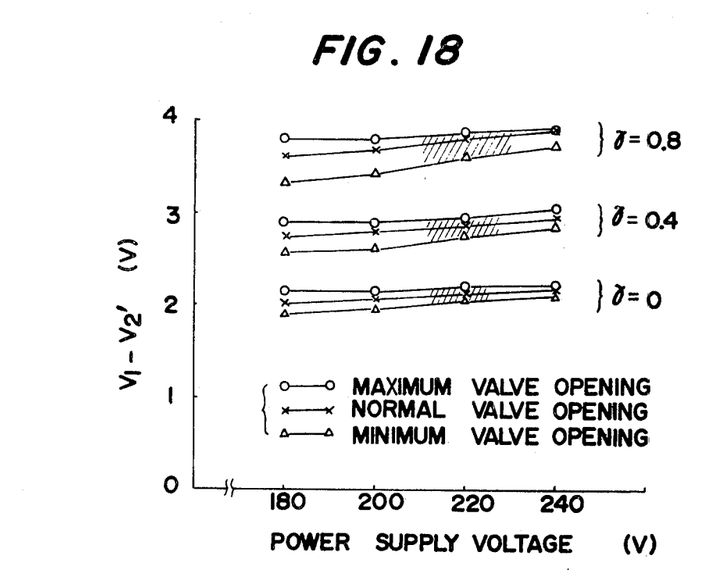

FIG. 17 shows the results of measurement of $(V_1 - V_2')$ and $\gamma$ with source voltage and load current being kept constant. In FIG. 18, the shaded portion shows a range of change in $(V_1 - V_2')$ corresponding to conceivable variations in the source voltage and the load current. It can be seen from this graph that the abrasion $\gamma$ of the thrust slide member 21 of the A-type motor can be detected also with a high precision. In connection with the equation (14), the precision of detection can be further improved by applying a bias voltage to $V_H$.

In the foregoing, the present invention has been described with reference to the bipolar electric motors. However, it will be appreciated that the invention can equally be applied to a motor having four or six poles. However, in such cases, the number of combinations of the relative positions among the detector coils as well as between the detector coils and the rotor slots is correspondingly increased so that the selection of appropriate combinations is required. In the following, discussion will be made relative to a motor of four poles by way of an example.

Assuming that the magnetic air gap is decreased by $\gamma$ and the rotor is revolved with eccentric radius $\delta$, the induced voltages $V_1$ and $V_2$ can be expressed as follows:

$$V_1 = V_s \sin \omega_s t + \{V_H + v_H + v \sin (\omega t + \beta_1)\} \sin (\omega_H t + \alpha_1) \quad (15)$$

$$V_2 = V_s \sin \omega_s t + \{V_H + v_H + v \sin (\omega t + \beta_2)\} \sin (\omega_H t + \alpha_2) \quad (16)$$

wherein $\beta_1$ and $\beta_2$ are phase angles which are determined by the angular mounted positions of the detector coils. The value $(\beta_1 - \beta_2)$ is determined in dependence upon the relative positions among the individual detector coils. $\alpha_1$ and $\alpha_2$ represent phase angles determined by the detector coils and the slot positions of the rotor in opposition to said coils. The value $(\alpha_1 - \alpha_2)$ can be determined by the number of the rotor slots. In case of a motor having n poles, $(\beta_1 - \beta_2)$ may take n different values including the case where the distance between the detector coils is equal to the distance between the poles or an integral multiple thereof. In the case of the motor having four poles, $(\beta_1 - \beta_2)$ thus can take four different values of 0, $\pi/2$, $\pi$ and $3/2\pi$. Because the difference of the phase angle between the adjacent rotor slots $(\alpha_1 - \alpha_2)$ is $2\pi$ $(\alpha_1 - \alpha_2)$ make take n different values for the motor of n poles regardless of the number of rotor slots. Accordingly, in the case of the motor having four poles, $(\alpha_1 - \alpha_2)$ make take four different values of 0, $\pi/2$, $\pi$ and $3/2\pi$. Thus, in the motor of four poles, $4 \times 4 = 16$ types of combinations of $(\alpha_1 - \alpha_2)$ and $(\beta_1 - \beta_2)$ are theoretically conceivable. Since five combinations of them, however, are impractical, the remaining number of usable combinations is 11. The detection voltage $(V_1 - V_2)$ is determined by substracting the equation (16) from the equation (15) and expressed as follows:

$$V_1 - V_2 = \{V_H + v_H + v \sin (\omega t + \beta_1)\} \sin (\omega_H t + \alpha_1) - \{V_H + v_H + v \sin (\omega t + \beta_2)\} \sin (\omega_H t + \alpha_2) \quad (17)$$

The results of computations for the eleven different types of combinations on the basis of the above equation (17) are summarized in the following Table 1, in which symbols "x" mean that corresponding combinations were actually impossible.

Table 1

| $\beta_1 - \beta_2$ \ $\alpha_1 - \alpha_2$ | $0$ | $\frac{\pi}{2}$ |
|---|---|---|
| $0$ | $0$ | X |
| $\frac{\pi}{2}$ | $\sqrt{2}\, v\sin(\omega t + \beta_1 + \frac{\pi}{4})$ $\times \sin(\omega_H t + \alpha_1)$ max: $\sqrt{2}\, v$ min: $0$ | $\sqrt{2(V_H + v_H)^2 + v^2 + 2\sqrt{2}\,(V_H + v_H)v\sin(\omega t + \beta_1 - \frac{\pi}{4})}$ $\times \sin(\omega_H t + \alpha_1 + \theta)$ max: $\sqrt{2}\,(V_H + v_H) + v$ min: $\sqrt{2}\,(V_H + v_H) - v$ |
| $\pi$ | $2v\sin(\omega t + \beta_1)$ $\times \sin(\omega_H t + \alpha_1)$ max: $2v$ min: $0$ | X |
| $\frac{3}{2}\pi$ | $\sqrt{2}\, v\sin(\omega t + \beta_1 - \frac{\pi}{4})$ $\times \sin(\omega_H t + \alpha_1)$ max: $\sqrt{2}\, v$ min: $0$ | $\sqrt{2(V_H + v_H)^2 + v^2 + 2\sqrt{2}\,(V_H + v_H)v\sin(\omega t + \beta_1 - \frac{\pi}{4})}$ $\times \sin(\omega_H t + \alpha_1 + \theta)$ max: $\sqrt{2}\,(V_H + v_H) + v$ min: $\sqrt{2}\,(V_H + v_H) - v$ |

| $\beta_1 - \beta_2$ \ $\alpha_1 - \alpha_2$ | $\pi$ | $\frac{3}{2}\pi$ |
|---|---|---|
| $0$ | X | X |
| $\frac{\pi}{2}$ | $\left\{2(V_H + v_H) + \sqrt{2}\, v\sin(\omega t + \beta_1 - \frac{\pi}{4})\right\}$ $\times \sin(\omega_H t + \alpha_1)$ max: $2(V_H + v_H) + \sqrt{2}\, v$ min: $2(V_H + v_H) - \sqrt{2}\, v$ | $\sqrt{2(V_H + v_H)^2 + v^2 + 2\sqrt{2}\,(V_H + v_H)v\sin(\omega t + \beta_1 - \frac{\pi}{4})}$ $\times \sin(\omega_H t + \alpha_1 + \theta)$ max: $\sqrt{2}\,(V_H + v_H) + v$ min: $\sqrt{2}\,(V_H + v_H) - v$ |
| $\pi$ | $2(V_H + v_H)\sin(\omega_H t + \alpha_1)$ max: $2(V_H + v_H)$ min: $2(V_H + v_H)$ | X |
| $\frac{3}{2}\pi$ | $\left\{2(V_H + v_H) + \sqrt{2}\, v\sin(\omega t + \beta_1 + \frac{\pi}{4})\right\}$ | $\sqrt{2(V_H + v_H)^2 + v^2 + 2\sqrt{2}\,(V_H + v_H)v\sin(\omega t + \beta_1 - \frac{\pi}{4})}$ |

Table 1-continued

| $\times \sin(\omega_H t + \alpha_1)$ | $\times \sin(\omega_H t + \alpha_1 + \theta)$ |
|---|---|
| max: $2(V_H + v_H) + \sqrt{2} \, v$ | max: $\sqrt{2} \, (V_H + v_H) + v$ |
| min: $2(V_H + v_H) - \sqrt{2} \, v$ | min: $\sqrt{2} \, (V_H + v_H) - v$ |

In addition to five impractical combinations as indicated by the symbols "x," the combination of $(\alpha_1 - \alpha_2 = 0)$ and $(\beta_1 - \beta_2 = 0)$ makes the value of $(V_1 - V_2)$ zero, which combination therefore cannot be employed. Thus, the usable combinations are reduced to ten variations. Furthermore, $(V_1 - V_2)$ takes the same value for two different combinations of $(\alpha_1 - \alpha_2 = 0)$ with $(\beta_1 - \beta_2 = \pi/2)$ and $(\beta_1 - \beta_2 = 3/2\pi)$. Additionaly, $(V_1 - V_2)$ takes the same value, too, for four different combinations of $(\alpha_1 - \alpha_2 = \pi/2$ or $3/2\pi)$ with $(\beta_1 - \beta_2 = \pi/2$ or $3/2\pi)$. $(V_1 - V_2)$ is the same for two different combinations of $(\alpha_1 - \alpha_2 = \pi)$ with $(\beta_1 - \beta_2 = \pi/2$ or $3/2\pi)$. In brief, it will be appreciated that five different detector outputs can be derived in the case of the motor having four poles, when possible combinations are compared with one another by referring to $(V_1 - V_2)$.

Next, let us examine which of the five different outputs as above stated is best preferred as the output signal of the detector for the R-type motor. As hereinbefore explained, when the R-type motor is driven accompanied with the rotational vibration or eccentricity caused by the abrasion $\delta$ of the bearing, the alternating voltage $v \sin(\omega t + \beta)$ is induced in every detector coil in superposition to the fundamental wave component. The abrasion $\delta$ and value $v$ are directly corelated to each other as already discussed. Because the value of $v_H$ can be regarded to be zero, it will be easily appreciated that the best combination is the one which allows the detection of the value of $(V_1 - V_2)$ as the function of only one variable $v$. The combinations which meet this condition can be found in the chart of Table 1. They are combinations of $(\alpha_1 - \alpha_2 = 0)$ with $(\beta_1 - \beta_2 = \pi/2, \pi$ and $3/2\pi)$. Among these three combinations, the detection output for both the combinations wherein $\beta_1 - \beta_2 = \pi/2$ and $\beta_1 - \beta_2 = 3/2\pi$ is the same. When the detector output for these two combinations is compared with the output available in the combination wherein $\beta_1 - \beta_2 = \pi$, it is found that the latter output is greater than the former by a factor $\sqrt{2}$. Accordingly, it is concluded that the combination of $(\alpha_1 - \alpha_2 = 0)$ and $(\beta_1 - \beta_2 = \pi)$ is the best. This combination can be attained by disposing the detector coils symmetrically to the center axis of rotation of the rotor, as is in the case of the bipolar machine, with the rotor slots opposing the respective detector coils being disposed in the same relative positions. Accordingly, the rotor slots must be of an even number.

In general, in case of the R-type motor having n poles, the detection of the eccentric revolution is most important, for which the combination of $(\alpha_1 - \alpha_2 = 0)$ and $(\beta_1 - \beta_2 = \pi)$ is best suited, and the rotor slot number must also be an even number.

Next, the A-type motor will be examined.

(a) In case only $v_H$ is induced and $v$ is zero:

This is the case in which only the abrasion of the thrust slide member occurs and the magnetic air gap is uniformly decreased. It will be seen from Table 1 that the greatest detection output of $v_H$ with $v$ being zero can be obtained from the three combinations of $(\alpha_1 - \alpha_2 = \pi)$ and $(\beta_1 - \beta_2 = \pi/2, \pi$ and $3/2\pi)$. The number of the rotor slots which makes these combinations possible can be determined by the following formula:

$$N_R = p/n \times (2m - 1/2) \tag{18}$$

wherein $N_R$: number of rotor slots (an integral), n: quotient of distance between two coils divided by distance between poles, and m: an integer greater than 1 selected so that $N_R$ is also an integer.

Assuming that $\alpha_1 - \alpha_2 = \pi$ and $\beta_1 - \beta_2 = \pi$ for the A-type motor having four poles, n=2 and thus $$N_R = (4/2) \times (2m - 1/2) = 2m - 1 \tag{19}$$

The detector coils can be disposed in the same manner as in the case of the bipolar machine. The rotor slots are of an odd number.

(b) In case both of $v_H$ and $v$ are produced:

When $v_H$ and $v$ are to be separately detected, $v_H$ is detected with the combination of $(\alpha_1 - \alpha_2 = \pi)$ and $(\beta_1 - \beta_2 = \pi)$, while $v$ is detected with the combination of $(\alpha_1 - \alpha_2 = 0)$ and $(\beta_1 - \beta_2 = \pi)$. If the synthesized signal of $v_H$ and $v$ is to be picked up, either the combination of $(\alpha_1 - \alpha_2 = \pi/2)$ and $(\beta_1 - \beta_2 = \pi/2)$ or the combination of $(\alpha_1 - \alpha_2 = \pi)$ and $(\beta_1 - \beta_2 = \pi/2)$ may be employed. However, the latter combination is preferred since a greater output is available.

Although the invention has been described in connection with applications to the R- and A-type rotary machines having two or four poles, it should be noted that the inventive idea of the present application may be embodied in the electric rotary machines having other number of poles.

In summary, it should be appreciated that the desired function of the detector apparatus according to the present invention can only be attained by determining the positions at which two detector coils are provided, and also by selectively determining the number of the rotor slots. Considering the fact that the selection of the number of the rotor slots is a factor playing an important role in the fundamental design and construction of electric rotary machines, it will be understood that the objects of the present invention as hereinbefore mentioned can not be attained simply by connecting two detector coils in series to each other, but the adaptation of the fundamental structure of the rotary machine so as to cooperate with said detector coils is necessarily required.

Figure 19:
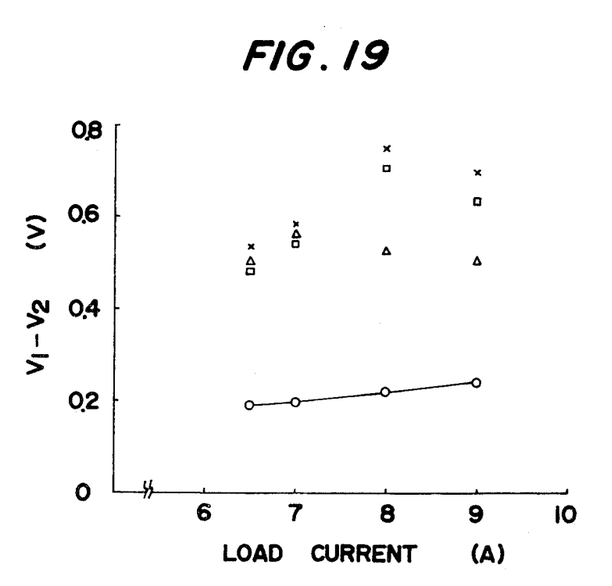

FIG. 19 graphically shows variations in the output voltage of the detector apparatus according to the present invention which were measured during phase-failure operation of a three phase induction motor in which the detector is built in. Load current is taken along the abscissa and the detector output is taken along the ordinate. Symbol "o" represents the normal operation of the motor, symbol "x" indicates a failure in the R-phase line, symbol "□" indicates the failure in the S-phase and the symbol "△" represents the failure in the T-phase. It is apparent from the graph of FIG. 9 that the detector apparatus according to this invention is in the position to detect with a high precision the occurrence of any phase failures in the operation of the three phase induction motor.

Furthermore, it has been proved that the detector apparatus according to this invention could alarm the shortcircuit as well as the earthing by increasing the output voltage of the detector.

Advantages of the present invention are as follows:

a. The electric rotary machine which incorporates therein the detector apparatus according to the invention can be tested for acceptance after assembly and before the shipment in order to examine if the rotary machine is constructed normally in respect of electrical and mechanical conditions or requirements to thereby assure the users of the high quality of the product.

b. The operation and maintenance of the rotary machines are carried out without failure since the abrasion of the bearing can be detected at an earlier stage than the conventional detectors which will respond only at the time when the abrasion increases to a predetermined limit value. The detector apparatus of the invention can give a foreknowledge of possible failure at an earlier time.

c. Because the detecting or sensing portions of the detector apparatus of this invention are accommodated within stator slots together with the main windings, extra space for installation, separate finishing and assembling, processes which may influence the accuracy in operation are not required contrary to the hitherto known detectors, which features also contribute to economical manufacturing costs. Some of the conventional detectors can not be used again when they were once used. The detector of this invention is completely free of this kind of drawback.

d. The detector of this invention is especially suited for use in protecting the unexposed motor such as the one in the canned motor-pump assembly, and is capable of detecting the abnormal rotation of the motor caused by foreign materials entering into the air gap and deformation or expansion of the can in addition to the abrasion of the bearing.

e. The detector of this invention can be advantageously used in a motor having a limited narrow shaft clearance such as a flame-proof type of motor.

f. According to the invention, only the detecting portions of the apparatus are assembled within the rotary machine. Thus, it is possible to use a portable indicator to read the output of the detector from the associated terminals in a terminal box in situ at the installation place of the machine.

g. Because the detector apparatus according to the invention can sense not only the mechanical failures in a running electric machine, but also electrical abnormalities in the motor windings as well as the power source network, it is safe to say that the inventive detector apparatus has a wide variety of uses and a greater utility in the associated technical fields.

While the invention has been described in connection with alternating induction motors, it should however be understood that the invention can equally be applied to A.C. and D.C. motors and generators having field cores, in which case the detector coils may be disposed in opposition to the magnetic air gap of the field core. In case of an electric machine of a rotating field type, the detector coils are provided in the rotor. In this manner, the present invention can be applied to any type of the electric rotary machines having field cores. Accordingly, the present invention will never be restricted to the embodiments shown and described herein, and it should be apparent to those skilled in the art that various changes and modifications can be made in the form of the invention without departing from the spirit and scope of the invention.

What is claimed is:

1. Apparatus for detecting faults occurring or initially existing in an electric rotary machine of an axial air gap type while the machine is running, comprising: a stator core; a rotor having slots; and a detector including a pair of detector coils disposed symmetrically in said stator core relative to the axis of rotation of said rotor and electrically so connected in series with each other that a fundamental wave voltage induced in said detector coils is cancelled and higher harmonic voltages, having a frequency which is determined by the number of said slots, are superimposed on each other resulting in a detection voltage which is the addition of said higher harmonic voltages, said rotor including an odd number of slots to enable said detector to detect said detection voltage of the added higher harmonic wave voltages induced in said coils.

* * * * *